(12) United States Patent
Tsujita et al.

(10) Patent No.: US 10,073,232 B2
(45) Date of Patent: Sep. 11, 2018

(54) OPTO-ELECTRIC HYBRID BOARD, AND PRODUCTION METHOD THEREFOR

(71) Applicant: NITTO DENKO CORPORATION, Ibaraki-shi, Osaka (JP)

(72) Inventors: Yuichi Tsujita, Osaka (JP); Naoyuki Tanaka, Osaka (JP)

(73) Assignee: NITTO DENKO CORPORATION, Ibaraki-shi (JP)

(*) Notice: Subject to any disclaimer, the term of this patent is extended or adjusted under 35 U.S.C. 154(b) by 0 days.

(21) Appl. No.: 15/517,267

(22) PCT Filed: Oct. 9, 2015

(86) PCT No.: PCT/JP2015/078820
§ 371 (c)(1),
(2) Date: Apr. 6, 2017

(87) PCT Pub. No.: WO2016/063752
PCT Pub. Date: Apr. 28, 2016

(65) Prior Publication Data
US 2017/0307833 A1      Oct. 26, 2017

(30) Foreign Application Priority Data
Oct. 24, 2014   (JP) .................................. 2014-217133

(51) Int. Cl.
*G02B 6/12*   (2006.01)
*G02B 6/42*   (2006.01)
(Continued)

(52) U.S. Cl.
CPC ............. *G02B 6/428* (2013.01); *G02B 6/122* (2013.01); *H05K 1/0269* (2013.01);
(Continued)

(58) Field of Classification Search
CPC ...... G02B 6/428; G02B 6/122; H05K 1/0269; H05K 1/0274; H05K 1/0326;
(Continued)

(56) References Cited

U.S. PATENT DOCUMENTS

| 8,135,251 B2 * | 3/2012 | Hodono | ................... G02B 6/42 29/829 |
| 8,606,063 B2 * | 12/2013 | Tsujita | ................ G02B 6/1221 385/126 |

(Continued)

FOREIGN PATENT DOCUMENTS

| JP | 2004-294857 A | 10/2004 |
| JP | 2004294857 A * | 10/2004 |

(Continued)

OTHER PUBLICATIONS

International Search Report dated Dec. 28, 2015, issued in counterpart International Application No. PCT/JP2015/078820 (2 pages).

(Continued)

*Primary Examiner* — Peter Radkowski
(74) *Attorney, Agent, or Firm* — Westerman, Hattori, Daniels & Adrian, LLP

(57) ABSTRACT

An opto-electric hybrid board is provided, which includes an electric circuit board including an electric wiring provided on a front surface of an insulation layer, an optical waveguide provided on a back side of the electric circuit board, and an outline processing alignment mark positioned adjacent to an outline processing portion on the front surface of the insulation layer on the same basis as the electric wiring, and has an outline formed by performing an outline processing operation with reference to the outline processing alignment mark. The opto-electric hybrid board has an
(Continued)

accurate outline and, therefore, can be attached to other component without an engagement failure or a connection failure.

6 Claims, 6 Drawing Sheets

(51) Int. Cl.
*G02B 6/122* (2006.01)
*H05K 1/02* (2006.01)
*H05K 1/03* (2006.01)
*H05K 3/18* (2006.01)

(52) U.S. Cl.
CPC ......... *H05K 1/0274* (2013.01); *H05K 1/0326* (2013.01); *H05K 1/0346* (2013.01); *H05K 3/18* (2013.01); *H05K 2201/0154* (2013.01); *H05K 2201/09918* (2013.01); *H05K 2203/166* (2013.01)

(58) Field of Classification Search
CPC ................ H05K 1/0346; H05K 3/18; H05K 2201/0154; H05K 2201/09918; H05K 2203/166
See application file for complete search history.

(56) References Cited

U.S. PATENT DOCUMENTS

| | | | |
|---|---|---|---|
| 9,128,240 B2 * | 9/2015 | Hatori | G02B 6/12 |
| 2010/0129026 A1 * | 5/2010 | Hodono | G02B 6/42 |
| | | | 385/14 |
| 2012/0195562 A1 * | 8/2012 | Tsujita | G02B 6/1221 |
| | | | 385/126 |
| 2014/0294341 A1 * | 10/2014 | Hatori | G02B 6/12 |
| | | | 385/14 |
| 2016/0274317 A1 * | 9/2016 | Tsujita | G02B 6/4214 |

FOREIGN PATENT DOCUMENTS

| | | |
|---|---|---|
| JP | 2007-241190 A | 9/2007 |
| JP | 2008-158221 A | 7/2008 |
| JP | 2009-31582 A | 2/2009 |
| JP | 2010-128200 A | 6/2010 |
| JP | 2012-155215 A | 8/2012 |
| JP | 2012-163649 A | 8/2012 |
| JP | 2015-87475 A | 5/2015 |

OTHER PUBLICATIONS

Notification of Transmittal of Copies of Translation of the International Preliminary Report on Patentability (Form PCT/IB/338) issued in counterpart International Application No. PCT/JP2015/078820 dated May 4, 2017 with Forms PCT/IB/373 and PCT/ISA/237. (11 pages).

Office Action dated Jun. 19, 2018, issued in counterpart Japanese Application No. 2014-217133, with English machine translation. (6 pages).

* cited by examiner

Related Art

OPTO-ELECTRIC HYBRID BOARD, AND PRODUCTION METHOD THEREFOR

TECHNICAL FIELD

The present disclosure relates to an opto-electric hybrid board including an electric circuit board and an optical waveguide stacked one on another, and a production method for the opto-electric hybrid board.

BACKGROUND ART

To cope with increase in information transmission amount, recent electronic devices and the like often employ opto-electric hybrid boards which include electric wiring as well as optical wiring and are capable of simultaneously transmitting electrical signals and optical signals. As shown in FIG. 7, a known opto-electric hybrid board includes, for example, an electric circuit board E including an insulation layer 1 such as of a polyimide serving as a substrate and an electric wiring 2 of an electrically conductive pattern provided on a front surface of the insulation layer 1, and an optical waveguide W provided on a back side of the electric circuit board E and optically coupled to an optical element mounted at a predetermined position on the electric wiring 2. A front surface of the electric circuit board E is protected with a cover lay 3 for insulation thereof. The optical waveguide W has a triple-layer structure including an under-cladding layer 6, a core 7 serving as an optical path, and an over-cladding layer 8.

The opto-electric hybrid board 10 may be mounted as it is in an electronic device, or may include an opto-electric connection ferrule attached to a distal end portion thereof for use as a connector for connection between a plurality of boards or between chips provided on a board.

Where a component such as the ferrule is attached to the opto-electric hybrid board 10, it is important to accurately position the component with respect to the opto-electric hybrid board 10 so as to prevent an optical loss. Therefore, the core 7 serving as the optical path needs to be accurately positioned with respect to the outline of the opto-electric hybrid board 10. Accordingly, the outline of the opto-electric hybrid board 10, particularly an end face of the opto-electric hybrid board 10 to be connected to the component, should be processed with higher dimensional accuracy.

Where the optical waveguide W per se is used as an optical connector, the outline processing of the optical waveguide W requires higher accuracy for the same reason as the outline processing of the opto-electric hybrid board 10. To meet this requirement, an optical waveguide production method for producing the optical waveguide W is proposed, as shown in FIG. 8, which includes the steps of forming an under-cladding layer 6, simultaneously forming a core 7 and outline processing alignment marks 11 from a core material on a surface (a lower surface in FIG. 8) of the under-cladding layer 6, and forming an over-cladding layer 8 over the core 7 on the under-cladding layer 6 (on a lower side in FIG. 8) with the alignment marks 11 uncovered (see PTL 1).

In the aforementioned production method, the core 7 serving as the optical path and the alignment marks 11 are formed on the same basis, so that the alignment marks 11 can be accurately positioned with respect to the core 7. Further, the alignment marks 11 are visible through the transparent under-cladding layer 6 as indicated by arrows in FIG. 8. With reference to the alignment marks 11, therefore, the outline processing operation can be advantageously performed on the optical waveguide W with higher accuracy.

RELATED ART DOCUMENT

Patent Document

PTL 1: JP-A-2012-155215

SUMMARY OF INVENTION

It is contemplated to employ the aforementioned method involving the simultaneous formation of the core 7 and the outline processing alignment marks 11 for the opto-electric hybrid board production method. However, the insulation layer 1 (see FIG. 7) of the electric circuit board E of the opto-electric hybrid board 10 is generally formed of a polyimide colored yellow or amber. Therefore, the alignment marks 11 provided on the back side are less visible through the colored insulation layer 1. This makes it difficult to accurately perform the outline processing operation with reference to the alignment marks 11.

In view of the foregoing, it is an object of the present invention to provide an opto-electric hybrid board including an outline processing alignment mark provided at an accurate position in a readily visible manner and to provide a production method for the opto-electric hybrid board.

According to a first inventive aspect to achieve the aforementioned object, there is provided an opto-electric hybrid board which includes: an electric circuit board including an insulation layer and an electric wiring provided on a front surface of the insulation layer; an optical waveguide provided on a side of the electric circuit board opposite to the electric wiring, relative to the insulation layer having the electric wiring provided on the front surface thereof; and an outline processing alignment mark positioned adjacent to an outline processing portion on the front surface of the insulation layer on the same basis as a basis for positioning the electric wiring provided on the front surface of the insulation layer; the opto-electric hybrid board having an outline formed with reference to the outline processing alignment mark.

According to a second inventive aspect, the outline processing alignment mark is made of the same material as the electric wiring in the opto-electric hybrid board. According to a third inventive aspect, the insulation layer is made of a polyimide resin in the opto-electric hybrid board.

According to a fourth inventive aspect, there is provided an opto-electric hybrid board production method, which includes the steps of: forming an electric wiring on a front surface of an insulation layer to prepare an electric circuit board; forming an optical waveguide on a side of the electric circuit board opposite to the electric wiring, relative to the insulation layer having the electric wiring provided on the front surface thereof, to fabricate an opto-electric hybrid board; and performing an outline processing operation on the opto-electric hybrid board to impart the opto-electric hybrid board with a predetermined outline; wherein the electric circuit board preparing step includes the step of forming an outline processing alignment mark in adjacent relation to an outline processing portion on the front surface of the insulation layer, the outline processing alignment mark being positioned on the same basis as the basis for positioning the electric wiring on the front surface of the insulation layer; wherein the opto-electric hybrid board outline processing step includes the step of performing the outline processing operation with reference to the outline processing alignment mark.

According to a fifth inventive aspect, the outline processing alignment mark is formed from the same material as the electric wiring in adjacent relation to the outline processing portion when the electric wiring is formed on the front surface of the insulation layer in the electric circuit board preparing step of the opto-electric hybrid board production method. According to a sixth inventive aspect, the insulation layer is made of a polyimide resin in the opto-electric hybrid board production method.

In the present disclosure, the term "outline processing operation" means a processing operation employing a laser cutting process, a grinding process, a machining process or other process for imparting the opto-electric hybrid board with the predetermined outline.

The inventors of the present invention conceived that the visibility of the alignment mark can be enhanced by forming the alignment mark on the front side rather than on the back side of the colored insulation layer for improvement of the accuracy of the outline processing operation to be performed on the opto-electric hybrid board, and conducted intensive studies. As a result, the inventors found that, where the alignment mark is not formed on the back side of the insulation layer (board) simultaneously with the core pattern but is formed on the front side of the insulation layer on the same basis as the electric wiring pattern which is accurately positioned for the positioning of the optical waveguide, the alignment mark positioning accuracy is excellent and, in addition, the alignment mark provided on the front side of the insulation layer can be directly viewed and hence has excellent visibility. Thus, the inventors attained the present invention.

The inventive opto-electric hybrid board is subjected to the outline processing operation with reference to the highly visible alignment mark positioned on the same basis as the electric wiring, and the electric wiring is highly accurately positioned with respect to the core pattern of the optical waveguide. Therefore, the opto-electric hybrid board is imparted with an accurate outline in highly accurate positional relation to the core pattern of the optical waveguide by performing the outline processing operation with reference to the alignment mark. Therefore, a ferrule or the like can be properly engaged with the opto-electric hybrid board or properly attached to a specific part of the opto-electric hybrid board without an engagement failure, a connection failure or other inconvenience.

The alignment mark is provided on the front side of the opto-electric hybrid board in adjacent relation to the outline processing portion, i.e., in adjacent relation to an end of the board. Therefore, an additional processing operation or a product quality inspecting operation can be advantageously performed with reference to the alignment mark.

In the inventive opto-electric hybrid board, the outline processing alignment mark is made of the same material as the electric wiring. This makes it possible to simultaneously form the electric wiring and the alignment mark, thereby further increasing the outline processing accuracy. Therefore, this arrangement is advantageous.

In the inventive opto-electric hybrid board, the insulation layer is made of a polyimide resin. Even if the insulation layer is colored yellow or amber, it is possible to perform the outline processing operation while directly viewing the alignment mark formed on the front surface of the insulation layer rather than viewing the alignment mark through the colored insulation layer. Therefore, this arrangement is particularly effective for practical applications.

In the inventive opto-electric hybrid board production method, the alignment mark can be accurately positioned on the front surface of the insulation layer on the same basis as the electric wiring. Therefore, the alignment mark can be disposed in accurate positional relation to the core pattern of the optical waveguide which is highly accurately positioned with respect to the electric wiring. With reference to the alignment mark, the outline processing operation can be performed on the opto-electric hybrid board in highly accurate positional relation to the core pattern. In addition, the alignment mark is disposed on the front side of the opto-electric hybrid board. Therefore, the alignment mark can be directly viewed by means of a camera or the like, so that the processing operation can be performed with reference to a clear image of the alignment mark.

In the inventive opto-electric hybrid board production method, the outline processing alignment mark is formed from the same material as the electric wiring in adjacent relation to the outline processing portion on the front surface of the insulation layer when the electric wiring is formed on the front surface of the insulation layer in the electric circuit board preparing step. In this case, the electric wiring and the alignment mark are formed on a single common basis, so that the alignment mark can be accurately positioned. Thus, the outline processing operation can be advantageously performed with further higher accuracy. Without the need for separately forming the alignment mark, this arrangement is advantageous in terms of time and costs.

In the inventive opto-electric hybrid board production method, even if the insulation layer of the opto-electric hybrid board is formed of the polyimide resin to be thereby colored, the outline processing alignment mark is visible. Therefore, the inventive production method is more advantageous than the conventional production method.

DESCRIPTION OF EMBODIMENTS

Embodiments of the present invention will hereinafter be described in detail based on the attached drawings. However, it should be understood that the invention be not limited to these embodiments.

Figure 1A:
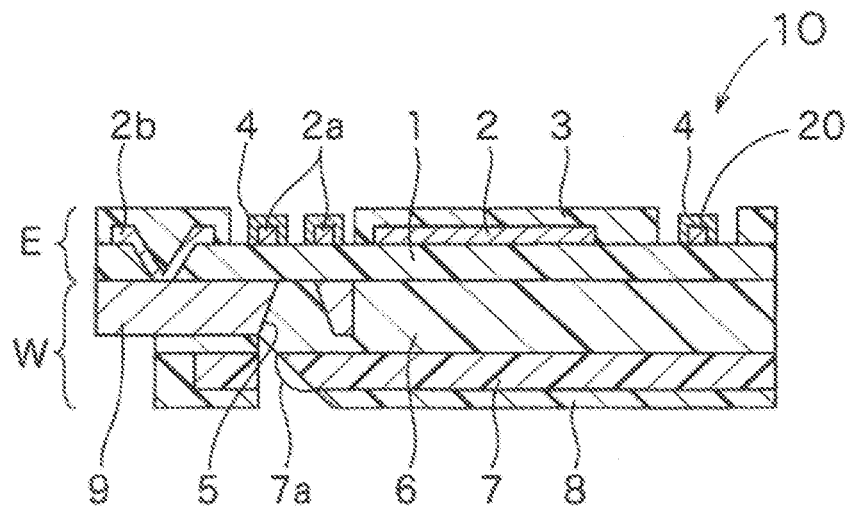
FIG. 1A is a longitudinal sectional view schematically illustrating an opto-electric hybrid board according to one embodiment of the present invention.
Figure 1B:
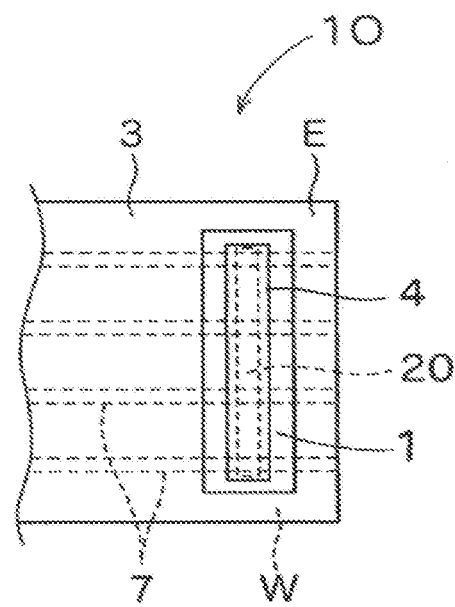
FIG. 1B is a partial plan view of the opto-electric hybrid board.

FIG. 1A is a longitudinal sectional view schematically illustrating an exemplary opto-electric hybrid board according to one embodiment of the present invention, and FIG. 1B is a partial plan view of the opto-electric hybrid board. The opto-electric hybrid board 10 includes an electric circuit board E including an insulation layer 1 and an electric wiring 2 provided on a front surface of the insulation layer 1, and an optical waveguide W provided on a back side of the insulation layer 1.

In the electric circuit board E, the electric wiring 2, which includes optical element mounting pads 2a, a ground electrode 2b, other element mounting pads and a connector mounting pad (not shown), is provided on the front surface of the insulation layer 1 such as of a polyimide. An alignment mark 20 made of the same material as the electric wiring 2 is provided on the front surface of the insulation layer 1. As shown in FIG. 1B, the alignment mark 20 is positioned adjacent to one of longitudinal ends of the opto-electric hybrid board 10, and is elongated transversely of the opto-electric hybrid board.

The alignment mark 20 is used as a reference for defining a processing position when an outline processing operation is performed to impart the opto-electric hybrid board 10 with a required predetermined outline in a production process for producing the opto-electric hybrid board 10 as will be described layer. A major feature of the present disclosure is that the alignment mark 20 is provided on the front surface of the insulation layer 1 as shown in FIG. 1B.

The electric wiring 2 excluding the pads 2a is protected with a cover lay 3 such as of a polyimide for insulation. Surfaces of the alignment mark 20 and the pads 2a uncovered with the cover lay 3 are each coated with an electroplating layer 4 such as of gold or nickel.

On the other hand, the optical waveguide W provided on the back side of the insulation layer 1 includes an under-cladding layer 6, a core 7 provided in a predetermined pattern on a surface (a lower surface in FIG. 1A) of the under-cladding layer 6, and an over-cladding layer 8 unified with the surface of the under-cladding layer 6 to cover the core 7. Reference numeral 9 designates a metal layer provided on a back surface of the insulation layer 1 for reinforcing the opto-electric hybrid board 10. The metal layer 9 is configured in a certain pattern so as not to cover a portion of the opto-electric hybrid board requiring flexibility. The metal layer 9 has a through-hole 5 through which an optical path extends between the core 7 and an optical element, and the under-cladding layer 6 intrudes into the through-hole 5. The metal layer 9 is optionally provided, and is not necessarily required.

The core 7 has a surface inclined at 45 degrees with respect to a core extending direction in association with the optical element mounting pads 2a of the electric circuit board E. The inclined surface serves as a light reflecting surface 7a which deflects light transmitted through the core 7 by 90 degrees into a light receiving portion of the light element or deflects light outputted from a light emitting portion of the optical element by 90 degrees into the core 7.

The opto-electric hybrid board 10 is produced, for example, in the following manner by an inventive production method (see FIGS. 2A to 2D, FIGS. 3A to 3D and FIG. 4).

Figure 2A:
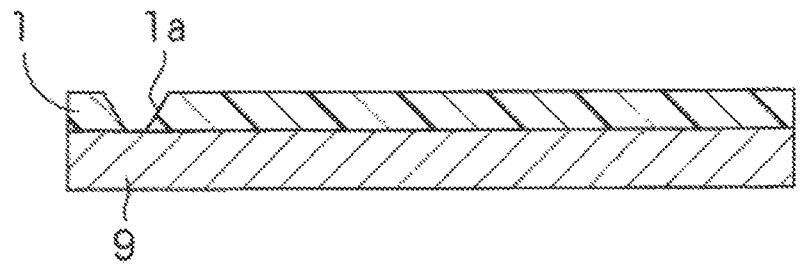
FIGS. 2A to 2D are diagrams for describing an electric circuit board fabricating step in a method of producing the opto-electric hybrid board.

As shown in FIG. 2A, a planar metal layer 9 is first prepared. Then, a photosensitive insulative resin such as containing a polyimide is applied onto a surface of the metal layer 9, and formed into an insulation layer 1 of a predetermined pattern by a photography process. In this embodiment, a hole 1a through which the surface of the metal layer 9 is partly exposed is formed in the insulation layer 1 for formation of a ground electrode 2b (see FIG. 1A) in contact with the metal layer 9. The insulation layer 1 has a thickness, for example, in a range of 3 to 50 μm. Exemplary materials for the metal layer 9 include stainless steel, copper, silver, aluminum, nickel, chromium, titanium, platinum and gold, among which stainless steel is preferred for rigidity. The thickness of the metal layer 9 depends on the material for the metal layer 9. Where stainless steel is used, the thickness of the metal layer 9 is, for example, in a range of 10 to 70 μm.

Figure 2B:
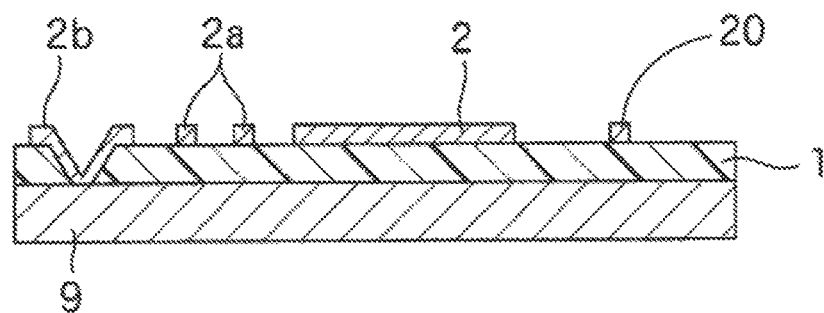

In turn, as shown in FIG. 2B, an electric wiring (including optical element mounting pads 2a, the ground electrode 2b and other pads, and this applies hereinafter) and an outline processing alignment mark 20 are simultaneously formed, for example, by a semi-additive method. In this method, a metal film (not shown) such as of copper or chromium is first formed on a surface of the insulation layer 1 by sputtering or electroless plating. The metal layer serves as a seed layer (a base layer for formation of an electroplating layer) in the subsequent electroplating step. After a photosensitive resist (not shown) is applied onto both surfaces of a stack consisting of the metal layer 9, the insulation layer 1 and the seed layer, holes for a pattern of the electric wiring 2 and holes for the alignment mark 20 are formed in a photosensitive resist layer present on the seed layer by a photolithography process. Thus, surface portions of the seed layer are exposed in bottoms of the holes. In turn, an electroplating layer such as of copper is formed on the surface portions of the seed layer exposed in the bottoms of the holes by electroplating. Then, the photosensitive resist is lifted off with a sodium hydroxide aqueous solution. Thereafter, a portion of the seed layer not formed with the electroplating layer is removed by soft etching. Remaining portions of a stack of the seed layer and the electroplating layer serve as the electric wiring 2 and the alignment mark 20.

Figure 2C:
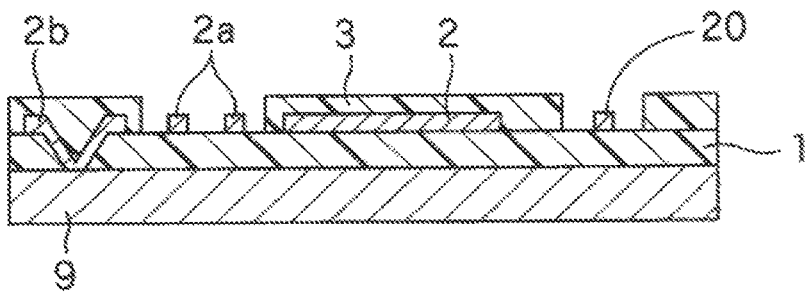

Subsequently, as shown in FIG. 2C, a photosensitive insulative resin such as containing a polyimide is applied and patterned by a photolithography process to form a cover lay 3 on a portion of the electric wiring 2 other than the optical element mounting pads 2a and the other pads.

Figure 2D:
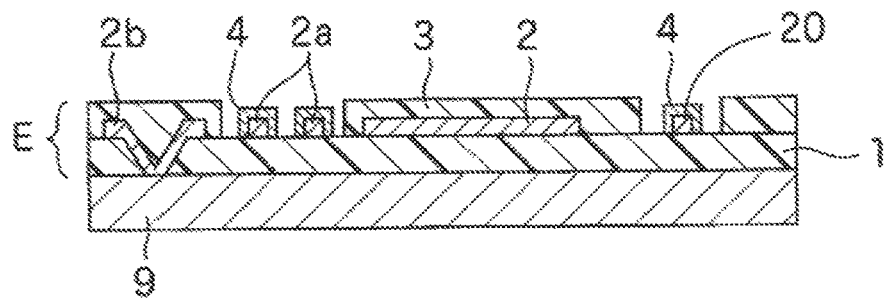

In turn, as shown in FIG. 2D, an electroplating layer 4 is formed on surfaces of the optical element mounting pads 2a, the other pads and the alignment mark 20. Thus, an electric circuit board E is fabricated.

A photosensitive resist is applied onto both surfaces of a stack of the metal layer 9 and the electric circuit board E, and then holes are formed in a photosensitive resist layer present on a back surface of the metal layer 9 (opposite from the electrical circuit board E) as corresponding to an unnecessary portion and a light path through-hole formation portion of the metal layer 9 by a photolithography process. Thus, back surface portions of the metal layer 9 are exposed in the holes.

Figure 3A:
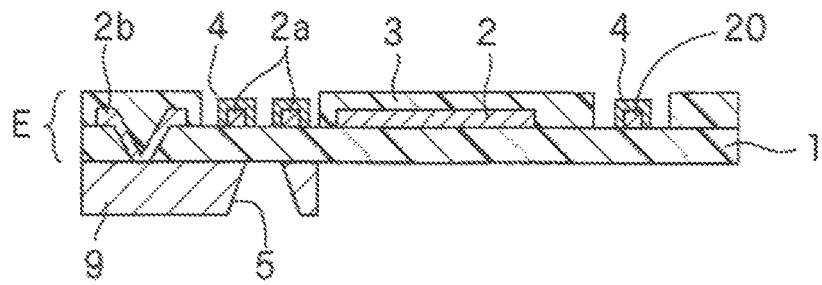
FIGS. 3A to 3D are diagrams for describing an optical waveguide fabricating step in the method of producing the opto-electric hybrid board.

Then, the exposed portions of the metal layer 9 are removed by etching with the use of an etching aqueous solution suitable for the metal material for the metal layer 9 (with the use of a ferric chloride aqueous solution, for example, where the metal layer 9 is a stainless steel layer), whereby the insulation layer 1 is exposed in the removed portions. Thereafter, the photosensitive resist is lifted off with a sodium hydroxide aqueous solution or the like. Thus, as shown in FIG. 3A, the metal layer 9 is formed only in a region requiring reinforcement and, at the same time, an optical path through-hole 5 is formed.

Figure 3B:
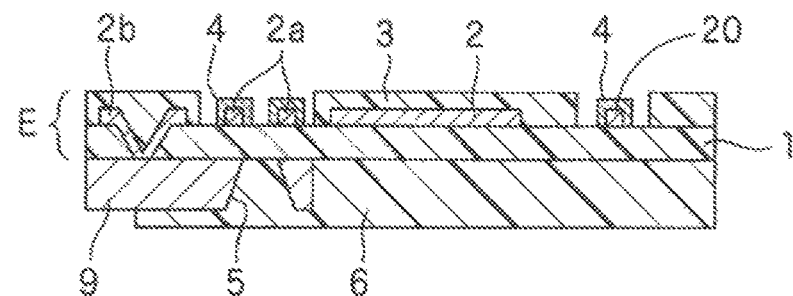

Subsequently, an optical waveguide W (see FIG. 1A) is fabricated on the back surface of the insulation layer 1 (and on the back surface of the metal layer 9). More specifically, as shown in FIG. 3B, a photosensitive resin as a material for an under-cladding layer 6 is first applied onto the back surfaces (lower surfaces in FIG. 3B) of the insulation layer 1 and the metal layer 9, and then the resulting layer is cured by exposure to radiation. Thus, the under-cladding layer 6 is formed. At this time, the under-cladding layer 6 may be patterned in a predetermined pattern by a photolithography process. Thus, the under-cladding layer 6 is configured so as to intrude into the optical path through-hole 5 of the metal layer 9 to fill the through-hole 5. The under-cladding layer 6 generally has a greater thickness than the metal layer 9 (as measured from the back surface of the insulation layer 1). When a series of process steps for the fabrication of the optical waveguide W are performed, the back surface of the insulation layer 1 formed with the metal layer 9 faces up. In FIGS. 3A to 3D, however, the back surface of the insulation layer 1 is illustrated as facing down.

Figure 3C:
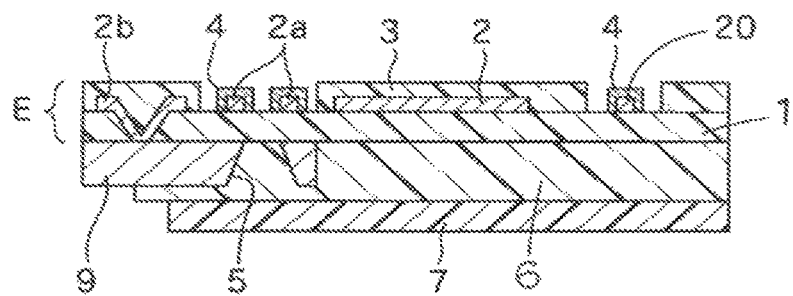

Then, as shown in FIG. 3C, a core 7 is formed in a predetermined pattern on a surface (a lower surface in FIG. 3C) of the under-cladding layer 6 by a photolithography process. The core 7 has a thickness, for example, in a range of 3 to 100 μm and a width, for example, in a range of 3 to 100 μm. An exemplary material for the core 7 is the same type of photosensitive resin as the under-cladding layer 6, but has a higher refractive index than the materials for the under-cladding layer 6 and an over-cladding layer 8 to be described later. The refractive index may be controlled by selecting the types and the formulations of the materials for the under-cladding layer 6, the core 7 and the over-cladding layer 8.

Figure 3D:
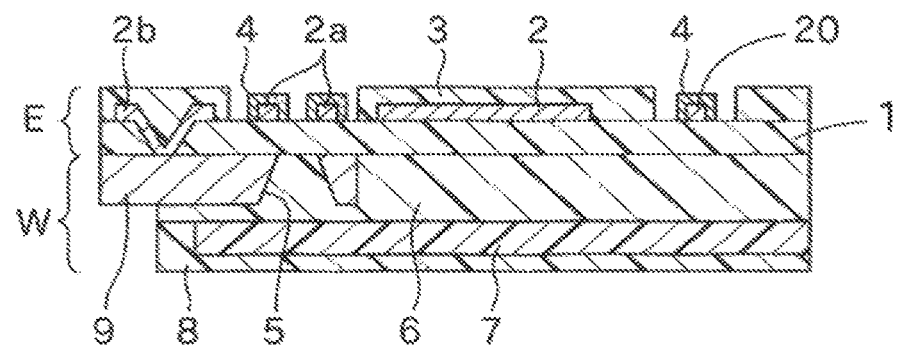

Subsequently, as shown in FIG. 3D, the over-cladding layer 8 is formed over a surface (a lower surface in FIG. 3D) of the under-cladding layer 6 by a photolithography process to cover the core 7. Thus, the optical waveguide W is fabricated. The over-cladding layer 8 has a thickness that is greater than the thickness of the core 7 and not greater than 300 μm (as measured from the surface of the under-cladding layer 6). An exemplary material for the over-cladding layer 8 is the same type of photosensitive resin as the under-cladding layer 6.

Specific examples of the formulations of the materials for the optical waveguide W are as follows.
<Materials for Under-Cladding Layer 6 and Over-Cladding Layer 8>
20 parts by weight of an epoxy resin containing an alicyclic skeleton (EHPE3150 available from Daicel Chemical Industries, Ltd.)
80 parts by weight of a liquid long-chain bifunctional semi-aliphatic epoxy resin (EXA-4816 available from DIC Corporation)
2 parts by weight of a photoacid generator (SP170 available from ADEKA Corporation)
40 parts by weight of ethyl lactate (available from Musashino Chemical Laboratory, Ltd.)
<Material for Core 7>
50 parts by weight of o-cresol novolak glycidyl ether (YDCN-700-10 available from Nippon Steel & Sumikin Chemical Co., Ltd.)
50 parts by weight of bisphenoxyethanol fluorene diglycidyl ether (OGSOL-EG available from Osaka Gas Chemicals Co, Ltd.)
1 part by weight of a photoacid generator (SP170 available from ADEKA Corporation)
50 parts by weight of ethyl lactate (available from Musashino Chemical Laboratory, Ltd.)

Then, a light reflecting surface 7a (see FIG. 1A) inclined at 45 degrees with respect to a core extending direction for optical coupling to an optical element to be mounted on the front side of the electric circuit board E is formed in a predetermined portion of the optical waveguide W by laser processing, cutting or the like. Then, the optical element is mounted on the pads 2a of the electric wiring 2 provided on the front side of the electric circuit board E, and other necessary components are mounted on the board.

Figure 4:
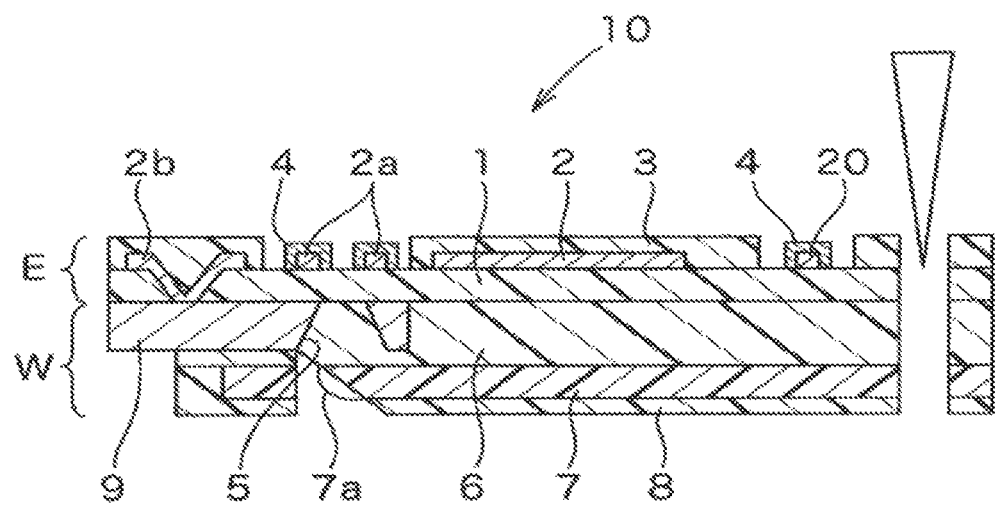
FIG. 4 is a diagram for describing an outline processing step in the method of producing the opto-electric hybrid board.

Thus, an opto-electric hybrid board 10 (yet to be subjected to an outline processing operation) is provided. Then, as shown in FIG. 4, a cutting line is defined at a position spaced a predetermined distance from the alignment mark 20 while the alignment mark 20 is viewed by means of an alignment camera or the like, and the outline processing operation is performed to cut the opto-electric hybrid board 10 along the cutting line by laser (e.g., YAG laser). Thus, the opto-electric hybrid board 10 is produced as having a predetermined length with its core 7 exposed to one end face.

Instead of the laser, other cutting methods such as a dicing saw may be used for the cutting of the opto-electric hybrid board 10.

The opto-electric hybrid board 10 thus produced (subjected to the outline processing operation) has accurate outline dimensions as a whole and is free from dimensional variations, because the end face of the opto-electric hybrid board 10 is processed by performing the cutting operation with higher dimensional accuracy with reference to the alignment mark 20 which is formed adjacent to the longitudinal end of the opto-electric hybrid board 10 on the same basis as the electric wiring 2. Therefore, a ferrule or the like can be advantageously engaged with the opto-electric hybrid board 10 or attached to a specific part of the opto-electric hybrid board 10 without an engagement failure, a connection failure or other inconvenience. Further, an additional processing operation and a product quality inspecting operation may be performed with reference to the alignment mark 20.

In addition, the outline processing alignment mark 20 advantageously ensures proper finishing without any influence on a laser processing operation or a dicing operation, because the outline processing alignment mark 20 is not located on the outline processing line (the cutting line in this embodiment) but located in adjacent spaced relation to the processing line. More specifically, if the alignment mark 20 made of the metal material is provided on the processing line, irregularity is liable to occur on a boundary between an alignment mark present portion and an alignment mark absent portion of the opto-electric hybrid board because of a difference in laser processing speed between the alignment mark present portion and the alignment mark absent portion in the laser processing operation. In the dicing operation, irregularity is also liable to occur on the boundary because of a difference in hardness between the alignment mark present portion and the alignment mark absent portion. In a grinding operation, metal powder of the alignment mark 20 consisting of metal material generated by the grinding is liable to scratch the end face. If the surface requiring higher processing accuracy has the irregularity or the scratches, an optical loss may result. Therefore, where the alignment mark 20 is not located on the processing line but located in adjacent relation to the processing line as in the aforementioned embodiment, it is possible to ensure excellent finishing of the opto-electric hybrid board processed with higher positional accuracy.

Figure 5:
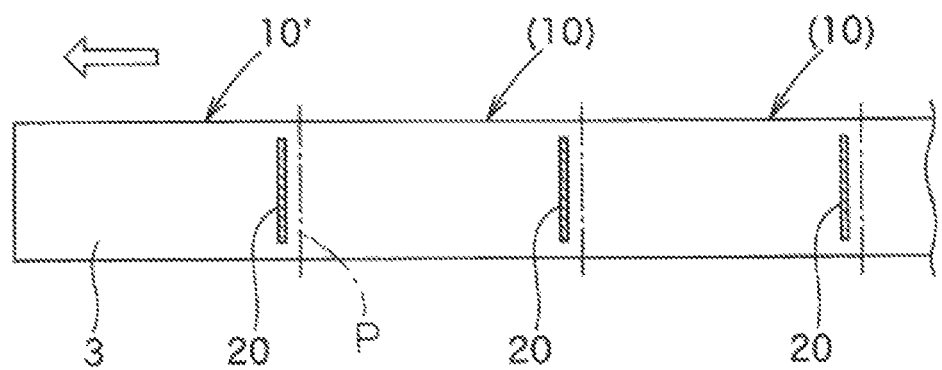
FIG. 5 is a diagram for describing an outline processing step according to another embodiment of the present invention.

In the aforementioned embodiment, the opto-electric hybrid board 10 yet to be subjected to the outline processing operation has a length slightly greater than a final length, and is cut at the end portion thereof to the final length. Where an elongated sequence of semi-finished opto-electric hybrid boards 10' produced by a roll-to-roll process as shown in FIG. 5 is sequentially cut into opto-electric hybrid boards 10 each having a predetermined length, for example, cutting positions indicated by one-dot-and-dash lines P are defined with reference to the alignment marks 20. While the alignment marks 20 are sequentially recognized by means of an alignment camera or the like, the semi-finished opto-electric hybrid boards 10' are properly positioned to be cut. Thus, the opto-electric hybrid boards 10 can be sequentially provided as each having a proper length without variations.

In addition, where the opto-electric hybrid board 10 is to be engaged with or attached to another component, the alignment mark 20 is effectively used as a dimensional reference for performing the outline processing operation (the cutting operation, the grinding operation or the like) to process the opto-electric hybrid board 10 into a desired outline in conformity with the shape of the component.

Figure 6A:
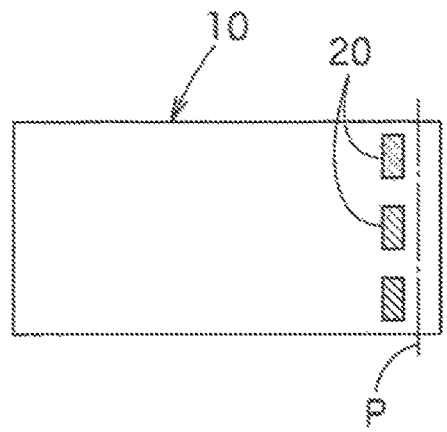
FIGS. 6A to 6E are diagrams for describing variations of an alignment mark to be employed in the present invention.
Figure 6B:
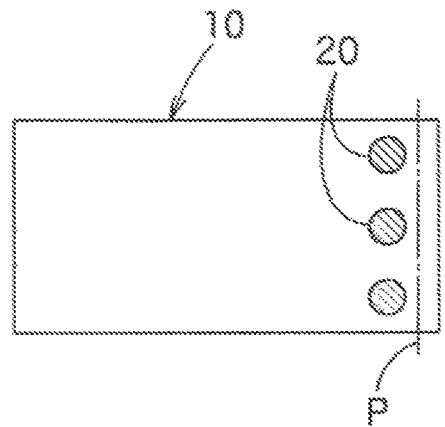
Figure 6C:
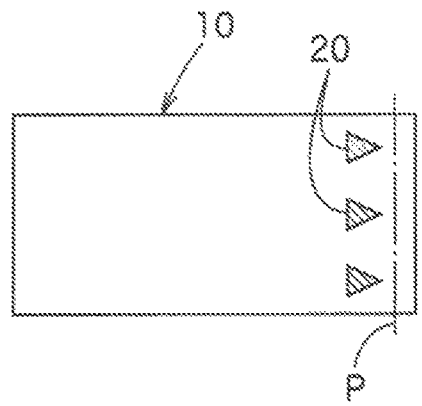
Figure 6D:
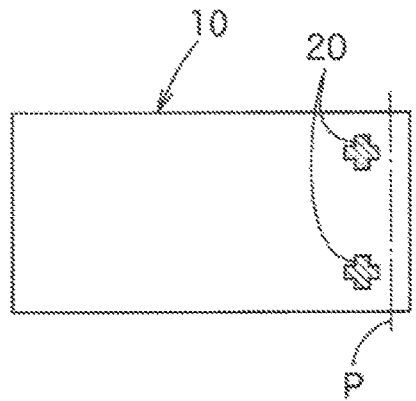
Figure 6E:
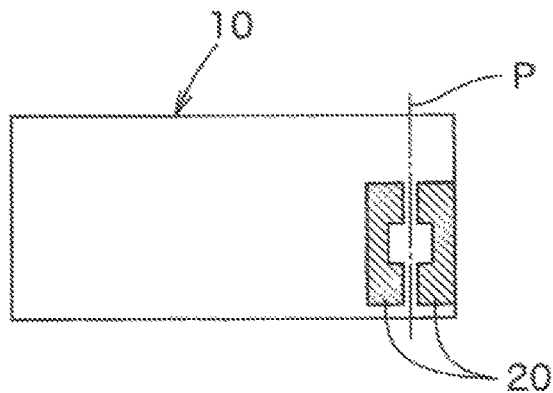
Figure 7:
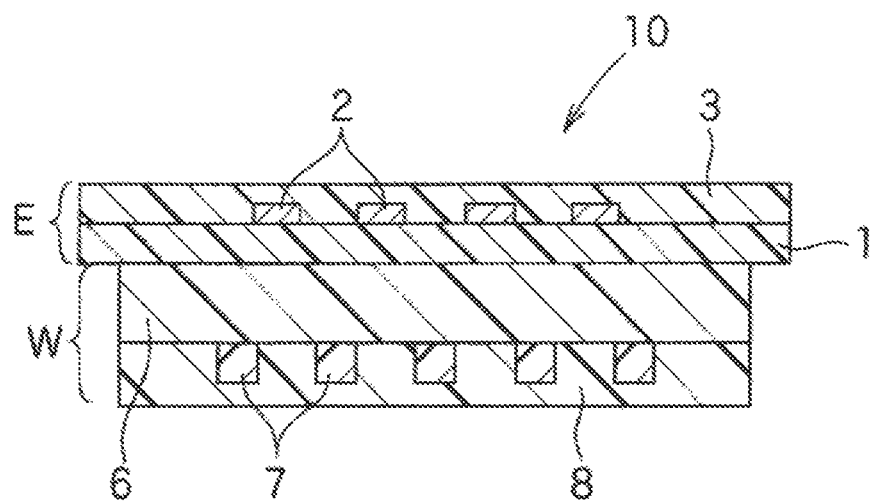
FIG. 7 is a diagram for describing a typical opto-electric hybrid board.
Figure 8:
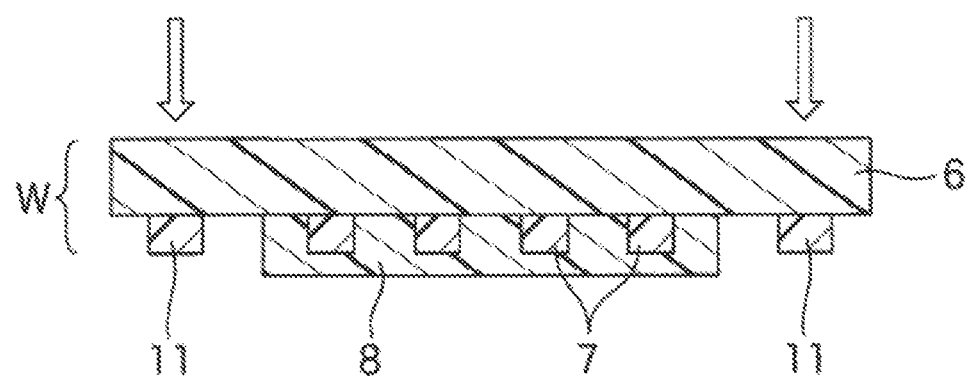
FIG. 8 is a diagram for describing alignment marks provided in a conventional optical waveguide.

The plan shape of the alignment mark 20 is not limited to a single elongated shape as shown in FIG. 1B. The alignment mark 20 may include a plurality of alignment marks 20 disposed adjacent to a cutting position indicated by a one-dot-and-dash line P as shown in FIGS. 6A to 6D which illustrate variations of the alignment mark 20 having different configurations. As shown in FIG. 6E, a pair of alignment marks 20 may be disposed on opposite sides of the cutting position to form a cross-shaped void therebetween. Similarly, an alignment mark 20 may be formed by covering a predetermined region with the electric wiring material and forming a round void or a polygonal void within the region. In any case, it is desired that the alignment mark 20 is not located on the cutting position P but is located in adjacent relation to the cutting position P for the aforementioned reason.

In the aforementioned embodiment, the alignment mark 20 is uncovered with the cover lay 3 for improvement of the visibility of the alignment mark 20, and the surface of the alignment mark 20 is covered with the electroplating layer 4 for protection thereof. Where the alignment mark 20 is sufficiently visible through the cover lay 3 depending on the color and the shape of the alignment mark 20 and the transparency of the cover lay 3, the alignment mark 20 as well as the electric wiring 2 may be covered with the cover lay 3.

In the opto-electric hybrid board 10, an alignment mark for positioning the light reflecting surface 7a (see FIG. 1A) in the core 7 and an alignment mark for positioning the optical element may be simultaneously formed from the electric wiring material, or a single alignment mark serving for these purposes may be formed from the electric wiring material when the electric wiring 2 is formed (see JP-2013-224450). Where these alignment marks and the outline processing alignment mark 20 are simultaneously formed, the formation of the electric wiring 2 and the formation of these alignment marks can be achieved on a single common basis in a single step. Thus, the opto-electric hybrid board 10 can be advantageously produced as having a higher quality with the electric wiring 2 and the alignment marks 20 being located in highly accurate positional relation.

In the aforementioned embodiments, the outline processing alignment mark 20 and the electric wiring 2 are simultaneously formed, but are not necessarily required to be simultaneously formed. In some case, the outline processing alignment mark 20 and the electric wiring 2 may be separately formed on the same basis. However, the simultaneous formation of the outline processing alignment mark 20 and the electric wiring 2 is preferred as in the aforementioned embodiments, because their positional relationship is more accurate.

While the specific embodiments of the present invention have been shown, the embodiments are merely illustrative of the invention but not limitative of the invention. It is contemplated that various modifications apparent to those skilled in the art could be made within the scope of the invention.

The present disclosure is employed to provide an opto-electric hybrid board which has highly accurate outline dimensions, and is stable in quality and free from any inconvenience when other component is engaged with the opto-electric hybrid board or is attached to a predetermined portion of the opto-electric hybrid board.

REFERENCE SIGNS LIST

E: Electric circuit board
W: Optical waveguide
1: Insulation layer
2: Electric wiring
10: Opto-electric hybrid board
20: Alignment mark

What is claimed is:

1. An opto-electric hybrid board comprising:
   an electric circuit board including an insulation layer and an electric wiring provided on a front surface of the insulation layer; and
   an optical waveguide provided on a side of the electric circuit board opposite to the electric wiring, relative to the insulation layer having the electric wiring provided on the front surface thereof;
   wherein a portion of an end portion of the opto-electric hybrid board is an outline processing surface;
   wherein an outline processing surface forming alignment mark is positioned adjacent to the outline processing surface on the front surface of the insulation layer on a same basis as a basis for positioning the electric wiring provided on the front surface of the insulation layer; and
   wherein the opto-electric hybrid board has the outline processing surface formed with reference to the outline processing surface forming alignment mark.

2. The opto-electric hybrid board according to claim 1, wherein the outline processing surface forming alignment mark is made of a same material as the electric wiring.

3. The opto-electric hybrid board according to claim 1, wherein the insulation layer is made of a polyimide resin.

4. An opto-electric hybrid board production method, comprising:
   forming an electric wiring on a front surface of an insulation layer to prepare an electric circuit board;
   forming an optical waveguide on a side of the electric circuit board opposite to the electric wiring, relative to the insulation layer having the electric wiring provided on the front surface thereof, to fabricate an opto-electric hybrid board; and
   performing an outline processing operation on a portion of an end portion of the opto-electric hybrid board to form an outline processing surface with reference to an outline processing surface forming alignment mark;
   wherein the electric circuit board preparing step includes forming the outline processing surface forming alignment mark in adjacent relation to an outline processing surface on the front surface of the insulation layer, the outline processing surface forming alignment mark being positioned on a same basis as a basis for positioning the electric wiring on the front surface of the insulation layer.

5. The opto-electric hybrid board production method according to claim 4, wherein the outline processing surface forming alignment mark is simultaneously formed from a same material as the electric wiring, in adjacent relation to the outline processing surface, when the electric wiring is formed on the front surface of the insulation layer in the electric circuit board preparing step.

6. The opto-electric hybrid board production method according to claim 4, wherein the insulation layer is made of a polyimide resin.

* * * * *